(12) United States Patent
Sobel et al.

(10) Patent No.: US 7,274,915 B2
(45) Date of Patent: Sep. 25, 2007

(54) LOW-NOISE TRANSMITTER SYSTEM AND METHOD

(75) Inventors: David Sobel, Oakland, CA (US); Augustine Kuo, Berkeley, CA (US)

(73) Assignee: Broadcom Corporation, Irvine, CA (US)

( * ) Notice: Subject to any disclaimer, the term of this patent is extended or adjusted under 35 U.S.C. 154(b) by 397 days.

(21) Appl. No.: 10/927,311

(22) Filed: Aug. 27, 2004

(65) Prior Publication Data
US 2005/0046475 A1 Mar. 3, 2005

Related U.S. Application Data

(60) Provisional application No. 60/498,703, filed on Aug. 29, 2003.

(51) Int. Cl.
*H04B 1/04* (2006.01)
(52) U.S. Cl. .................. 455/114.2; 455/127.1
(58) Field of Classification Search ............ 455/114.2, 455/127.1, 78; 375/296; 327/103, 363, 327/551; 330/291; 370/276, 278, 282
See application file for complete search history.

(56) References Cited

U.S. PATENT DOCUMENTS

| 5,640,128 A | * | 6/1997 | Wilhelm | ............ 330/308 |
| 6,188,498 B1 | * | 2/2001 | Link et al. | ............ 398/195 |
| 2003/0160171 A1 | * | 8/2003 | Parrish et al. | ............ 250/338.1 |

* cited by examiner

*Primary Examiner*—Nguyen T. Vo
(74) *Attorney, Agent, or Firm*—Sterne, Kessler, Goldstein & Fox, P.L.L.C.

(57) ABSTRACT

A low-noise transmitter architecture and method for high linearity, high output-swing systems such as Asymmetrical Digital Subscriber Line (ADSL) systems. The transmitter uses a switched-current DAC having a current source coupled to ground, followed by a resistive transimpedance amplifier (TIA). The resistance of the current source is typically large enough so that noise from an op-amp included in the TIA is not significantly amplified at the output. The current source may be passive and may include at least one resistor connected to ground. With a passive current source, portions of a signal output by the DAC enter either the current source or the resistive transimpedance amplifier, but not both, eliminating noise in the system produced by the current source.

26 Claims, 5 Drawing Sheets

LOW-NOISE TRANSMITTER SYSTEM AND METHOD

BACKGROUND OF THE INVENTION

1. Field of the Invention

The present invention relates to noise reduction in digital communication systems.

2. Related Art

In many communication systems, preventing interference between transmitted signals and received signals is essential. An example system is the Asymmetrical Digital Subscriber Line (ADSL) system. ADSL is a high-speed full duplex broadband transmission technique to connect a modem to the internet over ordinary telephone lines. For all ADSL applications, a hybrid circuit is used to couple receive (Rx) signals and transmit (Tx) signals from the telephone line. The hybrid circuit is also used to separate or decouple the Tx and Rx signals from each other.

Under ideal circumstances, the hybrid circuit is able to completely decouple the Tx and Rx signals from one another, so that the signal being transmitted does not interfere with the signal being received. However, due to imperfections in, for example, a telephone line and limited performance of the hybrid circuit, the hybrid circuit will not be able to completely decouple the Tx and Rx signals. Therefore, some amount of the residual Tx signal and Tx noise will be coupled onto the incoming Rx signal.

In order for the Rx signal to be correctly received, the interference from this Tx-to-Rx coupling must be minimized. This problem is exacerbated because the Rx signal is very small when compared to the Tx signal, and any residual Tx signal or noise can corrupt the Rx signal integrity.

As mentioned above, ADSL is only one type of communications system that experiences this problem. In many other communication systems, Tx noise needs to be minimized for similar reasons. In general, Tx noise must be limited so that the noise generated by a transmitter of a specific user does not interfere with the receiver of that same user (as in the case of ADSL), another user utilizing the same communications system, or another user using an entirely different communications system.

Although techniques exist for removing the residual Tx signal (e.g., echo cancellation), there are no comparable techniques to remove the residual Tx noise. Therefore, what is needed is a method and system for keeping Tx noise at a minimum.

SUMMARY OF THE INVENTION

A low-noise transmitter for use in a communications system such as ADSL includes a switched-current digital-to-analog converter ("DAC") followed by a resistive transimpedance amplifier ("TIA"). The output of the DAC is connected to the low-impedance input of the TIA. As a result, there is no significant signal swing at the output of the DAC. At least one current source is coupled to the DAC to establish proper common-mode levels in the transmitter. Further, noise is reduced because there is no need to convert the DAC current into a voltage prior to feeding the signal to the resistive TIA.

In one embodiment, the current source is active and adds current to the transmitted signal without requiring conversion to a voltage prior to entering the TIA. In another embodiment, the current source is passive, such as a resistor connected to ground. Because the passive current source does not inject a signal into the system, use of a passive current source further reduces noise in the system compared to the active current source. Use of a passive current source also reduces required area and power consumption in the transmitter, while requiring no additional pins or external components.

In both embodiments, the value of the resistance of the current source is typically large enough such that the noise from an op-amp in the TIA is not significantly amplified at the output. In this manner, the overall output noise of the transmitter is reduced compared to previous transmitters.

Although the present invention will be described using the example of a transmitter, the present invention may also be used as an amplification system in any type of digital system. Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION OF THE INVENTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications. For example, one of ordinary skill in the relevant art will recognize that the amplification circuit described herein need not be used solely as an ADSL transmitter, but that it may be utilized as a low-noise amplifier in any application where an analog signal is amplified from either a digital or analog source.

When used as an ADSL transmitter, the specifications of the ADSL system require the transmitter to be able to drive a large signal with a linearity exceeding 90 dB. In order to meet this high-swing, high-linearity requirement, a digitalto-analog converter ("DAC") followed by one or more stages of gain is used in various ADSL transmitter architectures.

Switched-Capacitor DAC Followed by Resistive Gain Amplifier

Figure 1:
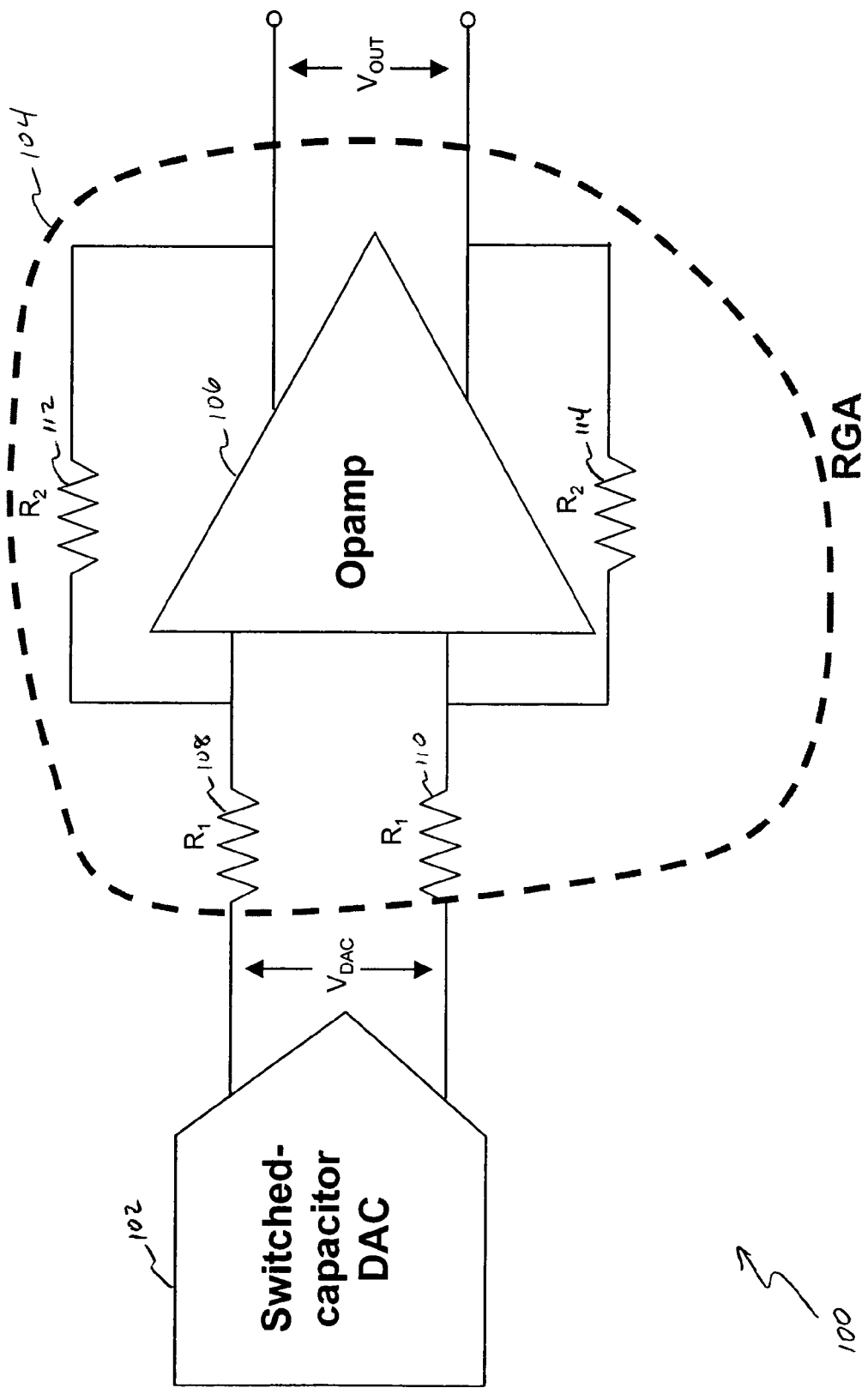
FIG. 1 is a diagram of an example transmitter that uses a switched-capacitor digital-to-analog converter ("DAC") and a resistive gain amplifier ("RGA").

FIG. 1 is a diagram of an example transmitter 100. Transmitter 100 includes a switched-capacitor DAC ("SC-DAC") 102 and a resistive gain amplifier ("RGA") 104. RGA 104 includes an op-amp 106, resistors 108 and 110, and feedback resistors 112 and 114. Resistors 108 and 110 each have a resistance $R_1$, while feedback resistors 112 and 114 each have a resistance $R_2$. The gain of RGA 104 is based on a ratio of feedback resistors 112 and 114 to resistors 108 and 110.

SC-DAC 102 outputs a voltage-based signal $V_{DAC}$. Op-amp 106 amplifies voltage-based signal $V_{DAC}$, the gain set by the ratio of feedback resistors 112 and 114 and resistors 108 and 110, and then outputs a voltage-based output signal $V_{OUT}$.

SC-DACs, such as SC-DAC 102, have relatively high noise levels due to the sampled-time nature of the switched capacitors. It is well known that switched-capacitor circuits have kT/C noise, which is noise due to fluctuation of charge stored on capacitance C. In order to reduce the power spectral density of this kT/C noise, either large capacitors must be used or very high oversampling ratios must be used. Large capacitors are impractical for integrated circuits because they require a large area. The oversampling ratio for an SC-DAC is limited by the speed of the circuit technology. Increasing the oversampling ratio of an SC-DAC usually requires a significant increase in power consumption.

Additionally, RGAs, such as RGA 104, are typically power-consuming and noisy devices. Since SC-DAC 102 typically has relatively low output swing, RGA 104 must have a reasonable gain. As shown in the following equations, the noise at the output of RGA 104 contributed by op-amp 106 is amplified by RGA 104 in a similar manner to an input signal $V_{DAC}$:

$$\frac{\overline{V_{OUT}^2}}{\Delta f} = 2 \cdot \left( 4kT \cdot R_1 \cdot A_{RGA}^2 + 4kT \cdot R_2 + \frac{\overline{V_N^2}}{\Delta f} \cdot (1 + A_{RGA})^2 + \frac{\overline{V_{DAC}^2}}{\Delta f} \cdot A_{RGA}^2 \right)$$ (Eq. 1)

where $$A_{RGA} = \frac{V_{OUT}}{V_{DAC}} = \frac{R_2}{R_1}.$$ (Eq. 2)

$A_{RGA}$ is the amplitude of the amplifier noise, and is a function of the gain of the amplifier. $V_N$ is the voltage input into op-amp 106. k is Boltzmann's constant, T is the temperature in °K, and C is the capacitance of the SC-DAC. Each of the resistor sets (i.e., resistors 108 and 110, and feedback resistors 112 and 114) adds noise to the system, as shown by the inclusion of $R_1$ and $R_2$ in Eq. 1. This puts a stringent noise specification upon op-amp 106 within RGA 104.

Figure 2:
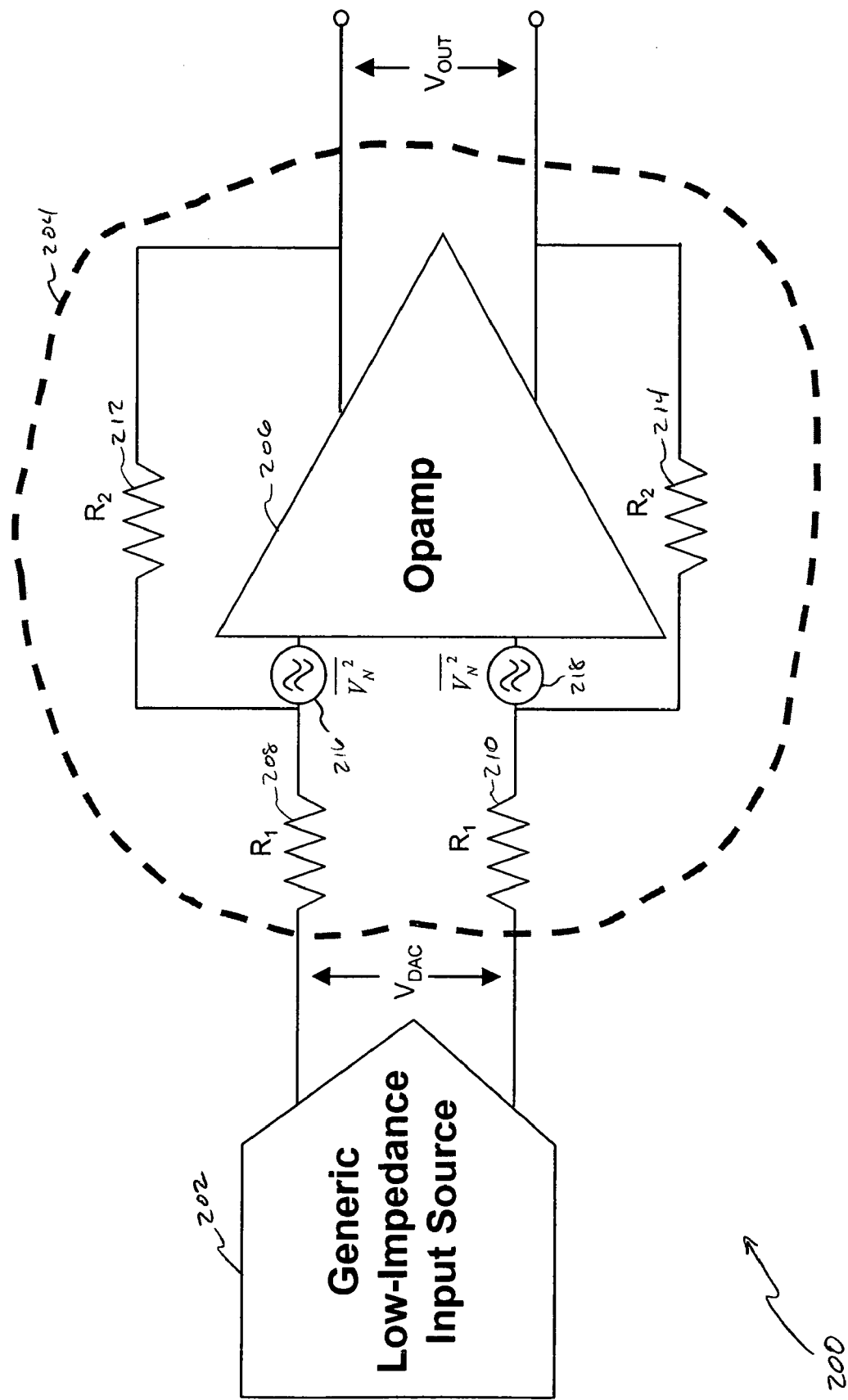
FIG. 2 is a diagram of another example transmitter that uses an RGA.

FIG. 2 is a diagram of an example transmitter 200. Transmitter 200 is similar in architecture to transmitter 100, but uses a generic low-impedance input source 202 in place of an SC-DAC. Transmitter 200 also includes an RGA 204 having an op-amp 206, resistors 208 and 210, feedback resistors 212 and 214, and voltage sources 216 and 218. Resistors 208 and 210 are approximately equal, each having a resistance $R_1$. Feedback resistors 212 and 214 are also approximately equal to each other, each having a resistance $R_2$. Op-amp 206 outputs an amplified signal $V_{OUT}$, wherein the gain is based on the ratio of feedback resistors 212 and 214 to resistors 208 and 210.

Switched-Current DAC with Resistive Load followed by RGA

Figure 3:
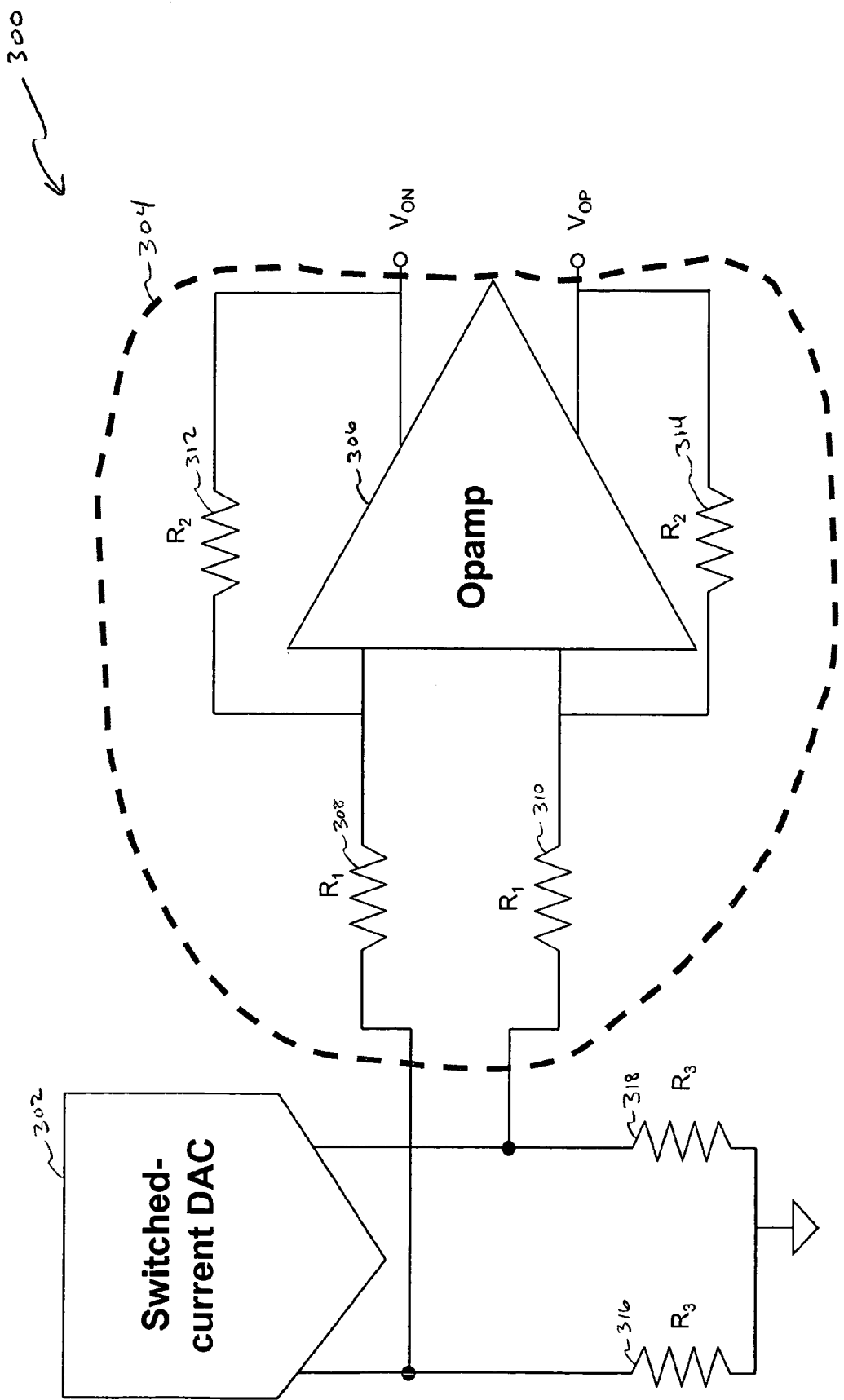
FIG. 3 is a diagram of an example transmitter that uses a switched-current DAC and an RGA.

FIG. 3 is a diagram of an example transmitter 300 that uses a switched-current DAC ("SI-DAC") 302 with an RGA 304 and a resistive load created by resistors 316 and 318. Like RGA 104 and RGA 204, RGA 304 includes an op-amp 306, resistors 308 and 310, and feedback resistors 312 and 314. Since an SI-DAC is used in place of an SC-DAC, resistors 316 and 318 are used to set the voltage swing at the output of the SI-DAC. Compared to the example of FIGS. 1 and 2, SI-DAC 302 followed by RGA 304 has a lower noise. This is because SI-DAC 302 does not add the kT/C noise of an SC-DAC. Even so, this architecture has several limitations.

First, transmitter 300 utilizes an RGA. Therefore, all the problems described with respect to RGA 104 and RGA 204 apply to RGA 304. Specifically, the signal is still affected by two sets of resistors (i.e., resistors 308 and 310, and feedback resistors 312 and 314) to create an output signal, which adds noise to the system.

Also, a limitation with high-linearity SI-DACs is that their output swing is typically severely limited. As shown in Eq. 1, if $V_{OUT}$ is assumed to be fixed, requirements are imposed on the product of $V_{DAC}$ and $A_{RGA}$. A large $A_{RGA}$ increases the total output noise of the transmitter. Therefore, transmitter 300 requires a reasonably large $V_{DAC}$. This can be difficult to achieve while maintaining high linearity.

In each of transmitters 100, 200, and 300, the act of converting the signal between current and voltage domains results in a large amount of output noise due to the resistors. Also, resistance $R_1$ from the resistors presents a load that needs to be driven by the previous stage. Thus, if the resistors could be removed, the noise and total power consumption of the overall circuit would be significantly reduced.

Switched-Current DAC with Active Current Source

Figure 4:
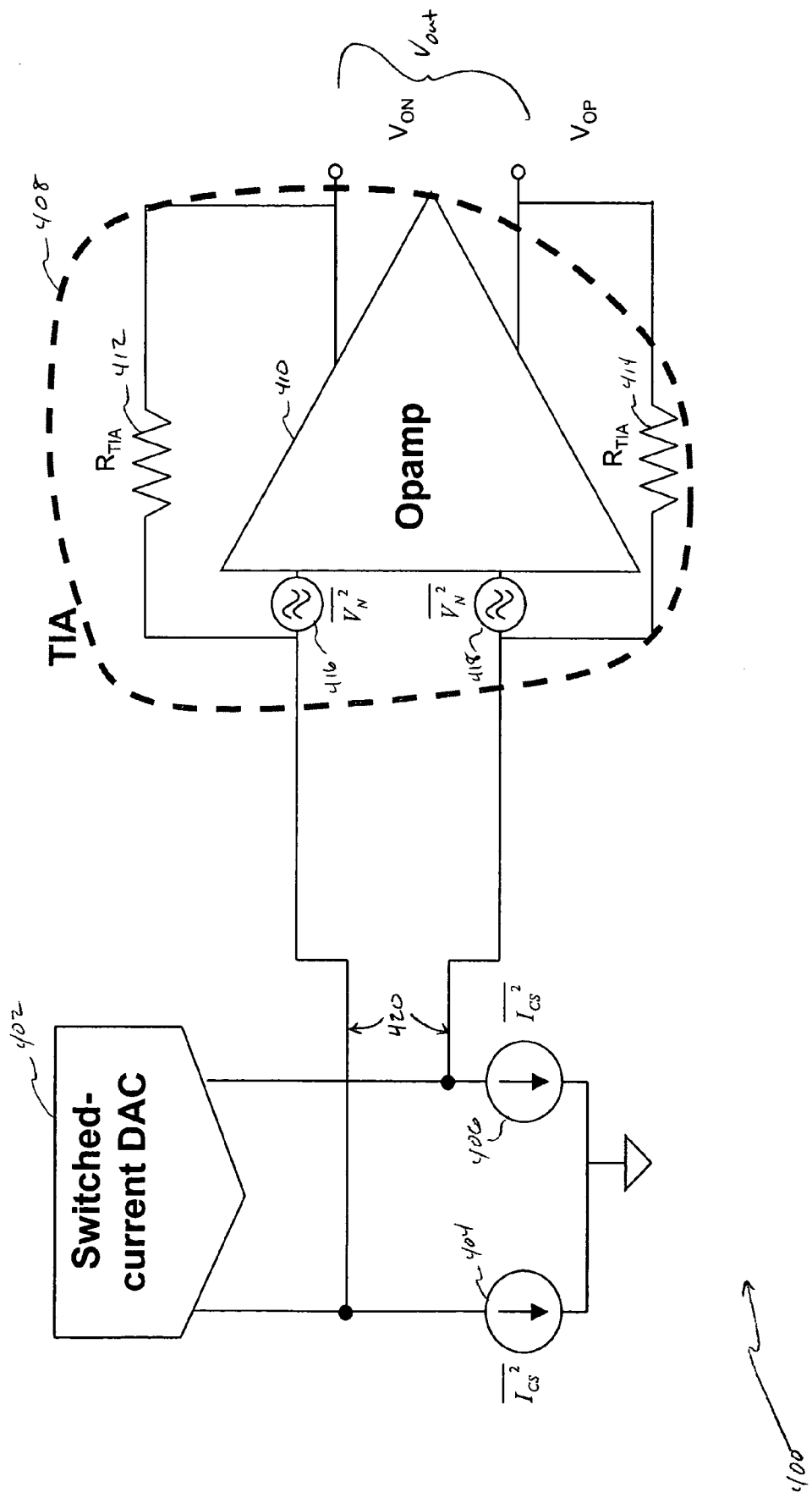
FIG. 4 is a diagram of an example transmitter that uses a switched-current DAC with an active current source and a resistive transimpedance amplifier ("TIA").

FIG. 4 is a diagram of an example transmitter 400 according to an embodiment of the present invention. Transmitter 400 includes an SI-DAC 402, active current sources 404 and 406, and a resistive transimpedance amplifier ("TIA") 408. TIA 408 includes an op-amp 410, feedback resistors 412 and 414, and voltage sources 416 and 418. SI-DAC 402 converts an input digital signal to an analog current-based signal. Because a TIA can convert a current-based signal to a voltage-based signal within the TIA itself, there is no need for resistors to perform this step before the signal is input to the TIA. The current-based signal from SI-DAC 402 can be input directly into resistive TIA 408.

Thus, an SI-DAC with active current sources 404 and 406 followed by a resistive TIA avoids many of the problems described above. For example, an input signal in transmitter 400 is affected by one less resistor set. This removes any noise associated with resistors in the examples of FIGS. 1, 2, and 3. Instead of amplifying an input voltage, resistive TIA 408 acts as a current-to-voltage converter and converts the current-based signal from SI-DAC 402 into a voltage-based signal. Resistive TIA 408 also amplifies the signal to produce an output signal $V_{OUT}$. Thus, as shown in the following noise equation, the output-referred amplifier noise is no longer a function of the gain of the amplifier stage:

$$\frac{\overline{V_{OUT}^2}}{\Delta f} = 2 \cdot \left( 4kT \cdot R_{TIA} + \frac{\overline{V_N^2}}{\Delta f} + \frac{\overline{I_{CS}^2}}{\Delta f} \cdot R_{TIA}^2 + \frac{\overline{I_{DAC}^2}}{\Delta f} \cdot R_{TIA}^2 \right).$$ (Eq. 3)

Further, the transimpedance gain is equal to the resistance of feedback resistors 412 and 414, or $R_{TIA}$, rather than a ratio of feedback resistors to resistors.

The inputs to the TIA create a virtual ground node at node 420. Since SI-DAC 402 is feeding into a virtual ground node, the signal swing at the output of SI-DAC 402 is kept small, even if a large output swing exists. Therefore, high linearity of the transmitter output $V_{OUT}$ can be maintained. Current sources 404 and 406 shown in FIG. 4 maintain proper common-mode levels throughout the transmitter and drive the analog current-based signal.

Current sources 404 and 406 shown in the embodiment of FIG. 4 are created from active devices. Because the active devices inject a signal into a node 420 between SI-DAC 402 and resistive TIA 408, they may contribute noise to the output of transmitter 400. In addition, the active devices may be biased by a network of similar active devices. These bias devices could contribute additional noise to the output. The noise produced by these devices can cause difficulties at low frequencies, where the flicker noise of the active devices can dominate, since the $I_{cs}^2/\Delta f$ term becomes very large. Since the ADSL transmit band, for example, is at approximately 100 kHz, the flicker noise of the active devices may overpower the Tx signal in such an application.

In order to limit the total noise contributed by the active devices, several steps can be taken. Flicker noise can be reduced by increasing the area of the active devices, and/or the noise from the bias devices can be effectively eliminated by attaching a large bypass capacitor to the bias network. However, increased area translates into increased parasitic capacitances. Further, attaching a bypass capacitor would require an additional pin on the package and an additional discrete component. Both of these steps would incur additional system costs.

Switched-Current DAC with Passive Current Source

Figure 5:
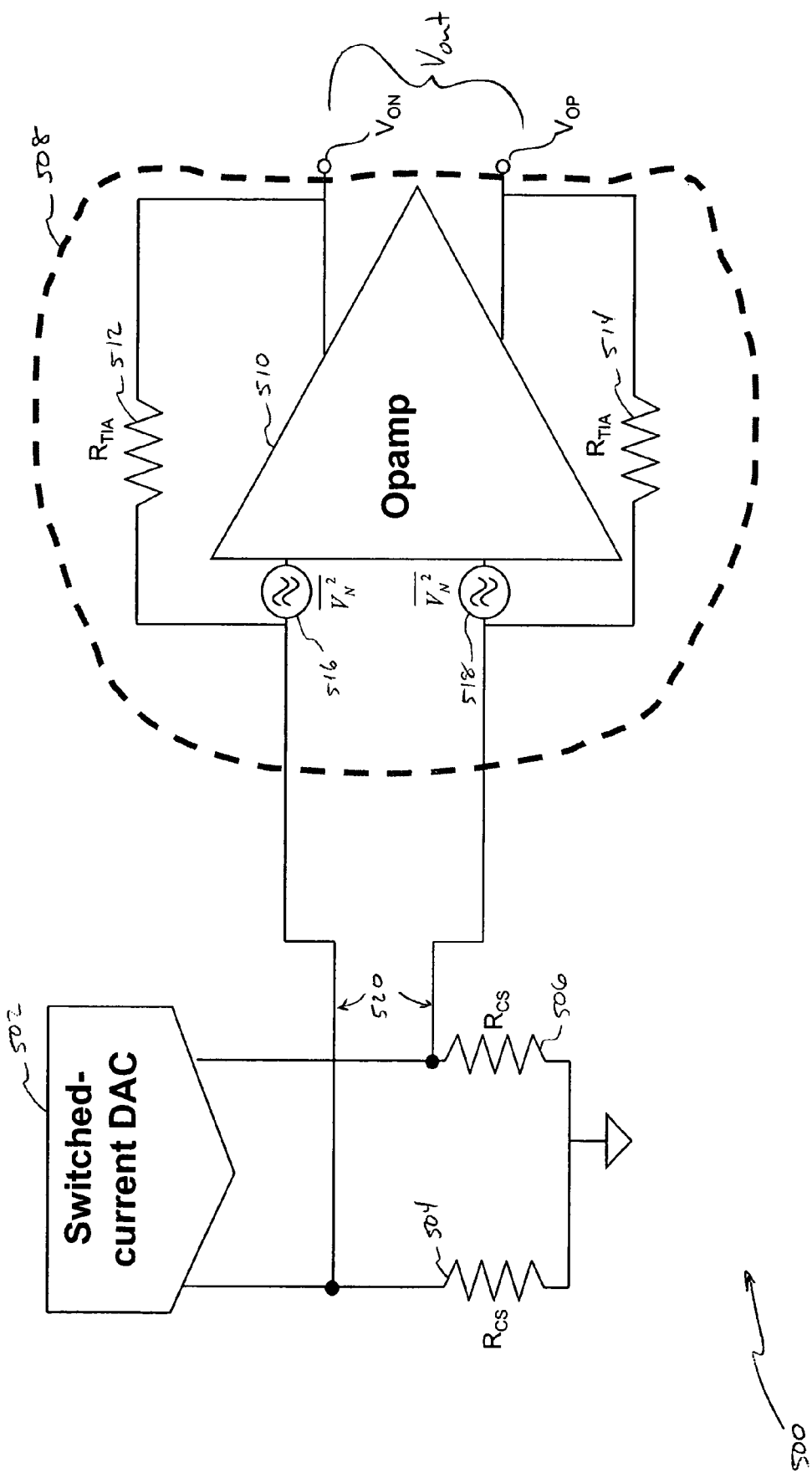
FIG. 5 is a diagram of an example transmitter that uses a switched-current DAC with a passive current source and a resistive TIA.

FIG. 5 is a diagram of an example transmitter 500 according to another embodiment of the present invention. Transmitter 500 includes an SI-DAC 502 with passive current sources 504 and 506 followed by a resistive TIA 508. TIA 508 includes an op-amp 510, feedback resistors 512 and 514, and voltage sources 516 and 518. Passive current sources 504 and 506 may be, for example, resistors connected to ground which are used to establish proper common-mode levels. In the example of FIG. 5, each of passive current sources 504 and 506 has a resistance $R_{CS}$.

Compared to transmitter 400, transmitter 500 has reduced noise due to the substitution of passive current sources for active current sources. Like transmitter 400, the signal in transmitter 500 is processed by one less resistor set compared to transmitters 100, 200, and 300, due to the lack of resistors. As shown in FIG. 5, current sources 504 and 506 branch off of a signal path 520 between SI-DAC 502 and TIA 508. Although a portion of the signal output by SI-DAC 502 may enter passive current sources 504 and 506, that portion of the signal is common-mode and hence not processed by TIA 508. Therefore, the differential transfer function of the signal is unaffected by the presence of passive current sources 504 and 506.

Thus, the total output noise of the embodiment of FIG. 5 is:

$$\frac{\overline{V_{OUT}^2}}{\Delta f} = 2 \cdot \left( 4kT \cdot R_{TIA} + \frac{\overline{V_N^2}}{\Delta f} \cdot \left(1 + \frac{R_{TIA}}{R_{CS}}\right)^2 + \frac{4kT}{R_{CS}} \cdot R_{TIA}^2 + \frac{\overline{I_{DAC}^2}}{\Delta f} \cdot R_{TIA}^2 \right)$$ (Eq. 4)

where $$\frac{R_{TIA}}{R_{CS}} < 1.$$ (Eq. 5)

The value of resistance $R_{CS}$ used in passive current sources 504 and 506 is typically large enough such that noise from op-amp 510 in TIA 508 is not significantly amplified at the output. For ADSL applications, $R_{CS}$ may be, for example, 1 kΩ. Also, passive current sources 504 and 506 have negligible flicker noise. Therefore, at low frequencies, the overall output noise of this topology is typically far lower than in systems described above. This allows improved application at lower frequencies than with previous systems. For instance, for ADSL applications the frequency range may be, for example, 20 kHz to 276 kHz. However, one of ordinary skill in the relevant art(s) will recognize that op-amp 510 may be tuned to any frequency for the same or alternate applications without departing from the spirit and scope of the present invention. Also, passive current sources 504 are much smaller in area and power consumption than active current sources, and require no additional pins or external components. Therefore, the embodiment of FIG. 5 is amenable to a low-cost, low-noise system, and effectively reduces noise from a Tx signal.

The embodiments described with reference to FIGS. 4 and 5 are also different from that of transmitter 300 in that the performance of the embodiments is quite different. First, transmitters 400 and 500 inject the signal from the SI-DAC into the TIA virtual ground formed by the current sources, so there is no significant signal swing at the output of the SI-DAC. Additionally, a resistive TIA amplifies op-amp noise far less than, for example, RGA 304 in transmitter 300. In transmitter 500, the purpose of resistors $R_{cs}$ used as passive current sources 504 and 506 is not to convert the current from SI-DAC 502 into a voltage; instead, resistors $R_{cs}$ are used as passive current sources to establish proper common mode. In such ways, the Tx noise in each of example transmitters 400 and 500 is reduced compared to example transmitters 100, 200, and 300.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A transmitter, comprising:

(a) a digital-to-analog converter (DAC);

(b) a current source coupled to an output of the DAC and to ground; and (c) a resistive transimpedance amplifier coupled to the output of the DAC, wherein a gain of the resistive transimpedance amplifier is approximately equal to a feedback resistance within the resistive transimpedance amplifier.

2. The transmitter of claim 1, wherein the current source is an active current source.

3. The transmitter of claim 1, wherein the current source is a passive current source.

4. The transmitter of claim 3, wherein the current source comprises at least one resistor coupled to ground.

5. The transmitter of claim 4, wherein a resistance of the current source is determined by the amount of noise produced by an operational amplifier in the resistive transimpedance amplifier.

6. The transmitter of claim 5, wherein the resistance of the current source is approximately 1 kΩ.

7. The transmitter of claim 1, wherein the current source establishes a common mode level for the transmitter.

8. The transmitter of claim 1, wherein the resistive transimpedance amplifier comprises:
(i) an operational amplifier;
(ii) a first feedback resistor coupled in parallel to a positive path of the operational amplifier; and
(iii) a second feedback resistor coupled in parallel to a negative path of the operational amplifier.

9. The transmitter of claim 8, wherein the first and second feedback resistors are variable resistors.

10. An amplification system for amplifying a digital signal, comprising:
(a) a digital-to-analog converter (DAC);
(b) a current source coupled to the output of the DAC and to ground; and
(c) a resistive transimpedance amplifier coupled to the output of the DAC,
wherein a gain of the amplification system is approximately equal to a feedback resistance within the resistive transimpedance amplifier.

11. The amplification system of claim 10, wherein the digital signal is an ADSL signal.

12. The amplification system of claim 10, wherein the current source is an active current source.

13. The amplification system of claim 10, wherein the current source is a passive current source.

14. The amplification system of claim 13, wherein the current source comprises at least one resistor coupled to ground.

15. The amplification system of claim 14, wherein a resistance of the current source is determined by the amount of noise produced by an operational amplifier in the resistive transimpedance amplifier.

16. The amplification system of claim 15, wherein a resistance of the current source is approximately 1 kΩ.

17. The amplification system of claim 10, wherein the resistive transimpedance amplifier comprises:
(i) an operational amplifier;
(ii) a first feedback resistor coupled in parallel to a positive path of the operational amplifier; and
(iii) a second feedback resistor coupled in parallel to a negative path of the operational amplifier.

18. A transmitter, comprising:
(a) a digital-to-analog converter (DAC);
(b) a resistive transimpedance amplifier;
(c) a signal path connecting the DAC and the resistive transimpedance amplifier; and
(d) a passive current source coupled between the signal path and ground,
wherein portions of a signal traversing the signal path enter either the current source or the resistive transimpedance amplifier.

19. The transmitter of claim 18, wherein the current source comprises at least one resistor coupled to ground.

20. The transmitter of claim 19, wherein a resistance of the current source is determined by the amount of noise produced by an operational amplifier in the resistive transimpedance amplifier.

21. The transmitter of claim 20, wherein a resistance of the current source is approximately 1 kΩ.

22. The transmitter of claim 18, wherein the resistive transimpedance amplifier comprises:
(i) an operational amplifier;
(ii) a first feedback resistor coupled in parallel to a positive path of the operational amplifier; and
(iii) a second feedback resistor coupled in parallel to a negative path of the operational amplifier.

23. The transmitter of claim 22, wherein a gain of the transmitter is approximately equal to a feedback resistance within the resistive transimpedance amplifier.

24. A method of amplifying a digital signal, comprising:
(a) converting the digital signal to an analog voltage-based signal;
(b) amplifying the analog voltage-based signal using a resistive transimpedance amplifier whose gain is approximately equal to a feedback resistance within the transimpedance amplifier;
(c) outputting the amplified voltage-based signal; and
(d) driving the analog voltage-based signal with a current source connected to ground.

25. The method of claim 24, wherein said step (d) comprises:
driving the analog voltage-based signal with an active current source.

26. The method of claim 24, wherein said step (d) comprises:
driving the analog voltage-based signal with a passive current source.

* * * * *